United States Patent [19]
Käse

[11] Patent Number: 5,894,495
[45] Date of Patent: Apr. 13, 1999

[54] ADAPTIVE DIGITAL FILTER

[75] Inventor: Rainer Käse, Düsseldorf, Germany

[73] Assignee: Toshiba Electronics Europe GmbH, Dusseldorf, Germany

[21] Appl. No.: 08/872,801

[22] Filed: Jun. 10, 1997

[30] Foreign Application Priority Data

Jun. 10, 1996 [EP] European Pat. Off. ............ 96109278

[51] Int. Cl.$^6$ ............................. H23H 7/30; H23H 7/40
[52] U.S. Cl. ..................... 375/232; 375/235; 364/724.19
[58] Field of Search ............................. 375/229, 232, 375/233, 235; 364/724.19, 724.2; 333/18, 28 R

[56] References Cited

U.S. PATENT DOCUMENTS

| | | |
|---|---|---|
| 4,037,160 | 7/1977 | Miloradovic et al. |
| 4,483,009 | 11/1984 | Honda et al. ............... 375/235 |
| 5,315,621 | 5/1994 | Gonzulo. |
| 5,513,223 | 4/1996 | Shoji ........................ 375/350 |
| 5,524,125 | 6/1996 | Tsujimoto ................... 375/233 |
| 5,537,443 | 7/1996 | Yoshino et al. ............. 375/340 |
| 5,594,677 | 1/1997 | Golla et al. ............... 364/724.16 |
| 5,636,153 | 6/1997 | Ikegaya et al. ............. 364/724.19 |

FOREIGN PATENT DOCUMENTS

| | | |
|---|---|---|
| 448742 | 10/1991 | European Pat. Off. . |
| 554494 | 8/1993 | European Pat. Off. . |
| 564751 | 11/1993 | European Pat. Off. . |
| 596610 | 5/1994 | European Pat. Off. . |
| 608665 | 8/1994 | European Pat. Off. . |

*Primary Examiner*—Chi H. Pham
*Assistant Examiner*—Emmanuel Bayard
*Attorney, Agent, or Firm*—Fitch, Even, Tabin & Flannery

[57] ABSTRACT

This invention relates to adaptive digital filters for echo cancellation in a bi-directional data transmission channel. Substantial hardware savings for a digital adaptive filter are possible, if hardware structures for performing filter operations are shared. In a digital adaptive filter with resource sharing filter operations are performed sequentially with a limited number of hardware structures. This invention discloses a digital adaptive filter with resource sharing with further hardware savings (FIG. 3). Corresponding to a characteristic decrease of the magnitude of the filter coefficients for echo cancellation, a first and second filter computation means ($4_A$, $4_B$) are connected to a coefficient storage means (3) with a different bit width to receive coefficients ($c_0, c_1 \ldots c_{N/2-2}, c_{N/2-1}; c_{N/2}, c_{N/2+1} \ldots c_{N-2}, c_{N-1}$) having different magnitudes and/or a first and second coefficient adapting means ($7_A$, $7_B$) are connected to the coefficient storage means (3) with a different bit width to receive coefficients ($c_0, c_1 \ldots c_{N/2-2}, c_{N/2-1}; c_{N/2}, c_{N/2+1} \ldots c_{N-2}, c_{N-1}$) having different magnitudes, allowing a hardware reduction the and reduction of the size of the filter device.

24 Claims, 7 Drawing Sheets

ADAPTIVE DIGITAL FILTER

The present invention relates to adaptive digital filters.

Digital filters can be applied for the purpose of echo cancellation during bidirectional transmission of signals via a single transmission channel. The coefficients of the digital filter are chosen such that the impulse response function of the digital filter matches the impulse response function of the transmission channel. If a signal s, transmitted via the transmission channel, is fed into the digital filter, the output e of the digital filter is equal to the echo received from the transmission channel. By subtracting the output signal e of the digital filter from a received signal s' the echo of the transmitted signal s is eliminated and a result signal f is obtained.

If the impulse response function of the transmission channel is not known or if it changes from time to time, the coefficients of the digital filter may be newly calculated and adapted, for example, using a LMS (least mean square) algorithm. Digital filters with coefficients being adapted during filter operation are referred to as adaptive digital filters.

FIG. 1 shows the structure of a known adaptive digital filter 100. The filter comprises a shift register 102 with N register steps $102_0$, $102_1$, $102_2$ ... $102_{N-3}$, $102_{N-2}$, $102_{N-1}$ for storing N symbols $s_0$, $s_1$, $s_2$ ... $s_{N-3}$, $s_{N-2}$, $s_{N-1}$ of a digital signal s, a coefficient memory 103 comprising N coefficient registers $103_0$, $103_1$, $103_2$ ... $103_{N-3}$, $103_{N-2}$, $103_{N-1}$ for storing N filter coefficients $c_0$, $c_1$, $c_2$ ... $c_3$, $c_{N-2}$, $c_{N-1}$. N multipliers $104_0$, $104_1$, $104_2$ ... $104_{N-3}$, $104_{N-2}$, $104_{N-1}$, each of which is assigned to one of said register steps $102_0$, $102_1$, $102_2$ ... $102_{N-3}$, $102_{N-2}$, $102_{N-1}$ and to a corresponding one of said coefficient registers $103_0$, $103_1$, $103_2$ ... $103_{N-3}$, $103_{N-2}$, $103_{N-1}$, and an adder 105.

A digital symbol $s_n$ of a transmitted signal s is fed into the first register step $102_0$ depending on a clock signal. Prior thereto the symbols stored in the steps $102_1$, $102_2$ ... $102_{N-3}$, $102_{N-2}$ are shifted into the respective next step of the shift register 102 every time before a new symbol sn is fed into the first register step $102_0$. Thereby, a symbol history of the digital signal s is stored in the register steps of the shift register 102. After a new symbol $s_n$ has been fed into the first register step $102_0$ of the shift register 102, every symbol $s_0$, $s_1$, $s_2$ ... $s_{N-3}$, $s_{N-2}$, $s_{N-1}$ of the signal history is multiplied by the respective multiplier $104_0$, $104_1$, $104_2$ ... $104_{N-3}$, $104_{N-2}$, $104_{N-1}$ with the corresponding filter coefficient $c_0$, $c_1$, $c_2$ ... $c_{N-3}$, $c_{N-2}$, $c_{N-1}$. Subsequently, the multiplication results are added by the adder 105. The output of the adder 105 is the output signal e of the digital filter.

As also shown in FIG. 1, the known adaptive digital filter 1 further comprises a first group of N multipliers $106_1$, $106_2$, $106_3$ ... $106_{N-3}$, $106_{N-2}$, $106_{N-1}$, a second group of N multipliers $107_1$, $107_2$, $107_3$ ... $107_{N-3}$, $107_{N-2}$, $107_{N-1}$ and N adders $108_1$, $108_2$, $108_3$ ... $108_{N-3}$, $108_{N-2}$, $108_{N-1}$, respectively assigned to an individual one of said register steps $102_0$, $102_1$, $102_2$ ... $102_{N-3}$, $102_{N-2}$, $102_{N-1}$ of the shift register 102 and the corresponding coefficients $c_0$, $c_1$, $c_2$ ... $c_{N-3}$, $c_{N-2}$, $c_{N-1}$.

In order to adapt the filter coefficients to match the channel response, the result signal f, obtained by subtracting the filter output signal e from the received signal s' and the symbols $s_0$, $s_1$, $s_2$ ... $s_{N-3}$, $s_{N-2}$, $s_{N-1}$ of a digital signal s, stored in the register steps $102_0$, $102_1$, $102_2$ ... $102_{N-3}$, $102_{N-2}$, $102_{N-1}$ are multiplied by the multipliers $106_1$, $106_2$, $106_3$ ... $106_{N-3}$, $106_{N-2}$, $106_{N-1}$ of the first group, the output signals of which are supplied to the multipliers $107_1$, $107_2$, $107_3$ ... $107_{N-3}$, $107_{N-2}$, $107_{N-1}$ of the second group where they are multiplied with a scaling factor $\alpha$. Each of the output signals of the multipliers $107_1$, $107_2$, $107_3$ ... $107_{N-3}$, $107_{N-2}$, $107_{N-1}$ of the second group is added by a respective one of adders $108_1$, $108_2$, $108_3$ ... $108_{N-3}$, $108_{N-2}$, $108_{N-1}$ to a respective one of previously stored filter coefficients $c_0$, $c_1$, $c_2$ ... $c_{N-3}$, $c_{N-2}$, $c_{N-1}$. The sums are stored as new, adapted coefficients $c_0$, $c_1$, $c_2$ ... $c_{N-3}$, $c_{N-2}$, $c_{N-1}$ in the respective one of the coefficient registers $103_0$, $103_1$, $103_2$ ... $103_{N-3}$, $103_{N-2}$, $103_{N-1}$.

An adaptive digital filter structure can be implemented by means of an integrated circuit in different ways, depending on the operation requirements. If fastest operation is needed, the hardware to perform the required filter computations and the coefficient adapting computations for all N symbols of the symbol history is implemented in parallel, as shown in FIG. 1. Only one clock cycle per symbol $s_n$ is needed to compute the filter output signal e, but the maximum chip area is required.

In many applications the operational speed is less critical, so that the number of multipliers and adders may be reduced. The available multipliers and adders are used to perform the required filter and coefficient adapting computations for all N symbols of the symbol history in a serial manner. This multiple usage of a hardware structure is called "resource sharing".

FIG. 2 shows a conventional realization of resource sharing for an adaptive digital filter with a symbol history of N symbols. In this particular case, the hardware to perform the required filter and coefficient adapting computations is provided such that only three symbols of the symbol history may be handled simultaneously in parallel.

Three multipliers $140_A$, $140_B$ and $140_C$ are provided to multiply three successive symbols of the symbol history stored in the shift register 120 with the three corresponding coefficients stored in a coefficient RAM 130. The adaptive digital filter further comprises a first group of three multipliers $160_A$, $160_B$ and $160_C$, a second group of three multipliers $170_A$, $170_B$ and $170_C$ and three adders $180_A$, $180_B$ and $180_C$ to simultaneously adapt three successive coefficients stored in a coefficient RAM 130.

The operation of the adaptive digital filter of FIG. 2 is controlled by a controller 111 and two multiplexers 109 and 110. Since the coefficients are stored in a coefficient RAM 130, which can be addressed according to known addressing techniques, additional multiplexers can be avoided but may be used in an alternative design. During filter operation, three successive register steps and the three corresponding coefficients are selected to be operated on in parallel. In other words, during a first cycle the register steps $120_0$, $120_1$, and $120_2$ are connected to the three multipliers $140_A$, $140_B$ and $140_C$, the first group of three multipliers $160_A$, $160_B$ and $160_C$ and the three corresponding coefficients $c_0$, $c_1$ and $c_2$ are selected and fed to the three multipliers $140_A$, $140_B$ and $140_C$ and the three adders $180_A$, $180_B$ and $180_C$. During the second cycle the register steps $120_3$, $120_4$ and $120_5$ are connected to the three multipliers $140_A$, $140_B$ and $140_C$, the first group of three multipliers $160_A$, $160_B$ and $160_C$ and the three corresponding coefficients $c_3$, $c_4$ and $c_5$ are selected and fed to the three multipliers $140_A$, $140_B$ and $140_C$ and the three adders $180_A$, $180_B$ and $180_C$. Likewise all register steps and coefficients to N−3, N−2 and N−1 are processed.

The output of the adder 150 for each cycle is stored in an intermediate register 112, the content of which is input into the adder 150 during the next cycle, until all N filter coefficients and symbols of the symbol history have been processed. Accordingly, N/3 cycles are required to compute an output value e for every new symbol $s_n$.

3

The known approach of resource sharing in an adaptive digital filter leads to a substantial reduction of required chip area although additional structures, for example the controller and the two multiplexers, are necessary. The reduction is achieved by providing only a limited number of filter computation and coefficient adapting means. The chip area required by an individual one of said filter computation and coefficient adapting means is determined by the magnitude of the largest symbol and/or coefficient to be processed.

Nevertheless, it is desired to further reduce the required chip area of the adaptive digital filter.

Therefore, it is the object of the invention to propose an adaptive digital filter requiring a further reduced chip area.

This object is solved by an adaptive digital filter device, comprising storage means 2 for storing a plurality of digital symbols $s_0, s_1, s_2 \ldots s_{N-3}, s_{N-2}, s_{N-1}$ representing the symbol history of a signal s; coefficient storage means 3 for storing a plurality of filter coefficients $c_0, c_1, c_2 \ldots c_{N-3}, c_{N-2}, c_{N-1}$ each of which corresponds to one of said of symbols $s_0, s_1, s_2 \ldots s_{N-3}, s_{N-2}, s_{N-1}$; first and second filter computation means $4_A, 4_B$ for performing filter computations on the basis of said symbols and said filter coefficients; adding means 5 for adding the output of said first and second filter computation means $4_A, 4_B$ and for outputting a filter value e; first and second coefficient adapting means $7_A, 7_B$ for adapting said filter coefficients $c_0, c_1, c_2 \ldots c_{N-3}, c_{N-2}, c_{N-1}$ stored in said coefficient storage means 3; and control means 6 for controlling the operation of the adaptive digital filter; characterized in that said first and second filter computation means $4_A, 4_B$ are connected to said coefficient storage means 3 with a different bit width to receive coefficients $c_0, c_1 \ldots c_{N/2-2}, c_{N/2-1}, c_{N/2}, c_{N/2+1} \ldots c_{N-2}, c_{N-1}$ having different magnitudes and/or said first and second coefficient adapting means $7_A, 7_B$ are connected to said coefficient storage means 3 with a different bit width to receive coefficients $c_0, c_1 \ldots c_{N/2-2}, c_{N/2-1}, c_{N/2}, c_{N/2+1} \ldots c_{N31\,2}, c_{N-1}$ having different magnitudes.

By introducing a different bit width for the connection of the first and second filter computation means $4_A, 4_B$ and/or for the first and second coefficient adapting means $7_A, 7_B$ to the coefficient storage means 3 a reduction of the size of the first or second filter computation means $4_A, 4_B$ and/or of the first or second coefficient adapting means $7_A, 7_B$ and thus of the required chip area is achieved. If, for example, the bit width for the connection of the second filter computation means $4_B$ and for the second coefficient adapting means $7_B$ is smaller than the bit width for the connection of the first filter computation means $4_A$ and for the first coefficient adapting means $7_A$, the hardware structure of the second filter computation means $4_B$ and the second coefficient adapting means $7_B$ requires less chip area due to the lower bit resolution in comparison with the first filter computation means $4_A$ and the first coefficient adapting means $7_A$. In the prior art, the same bit resolution is used for all filter computation means and all coefficient adapting means so that in comparison with the present invention a larger chip area is needed.

Further, by introducing a different bit widths for the connections of the first and second filter computation means $4_A, 4_B$ and/or for the first and second coefficient adapting means $7_A, 7_B$ the coefficients are stored with different bit resolutions and the chip area for the coefficient storage means 3 and likewise of the area for the buses for connecting the coefficient storage means 3 is reduced and excessive capacitive loads caused by the buses are avoided. Thus, the object of the invention can also be solved by providing a coefficient storage means 3 with reduced size for storing coefficients of different bit resolution.

4

Still further, the reduction of the resolution of the means for filter computation 4 allows to reduce the hardware and the size of the adding means 5.

In the following the invention will be described with reference to embodiments and drawings.

BRIEF DESCRIPTION OF THE DRAWINGS

In FIG. 3, a first embodiment of the adaptive digital filter according to the present invention is shown. The adaptive digital filter 1 comprises storage means 2 for storing N symbols $s_0, s_1, s_2 \ldots s_{N-3}, s_{N-2}, s_{N-1}$ representing the symbol history of a digital signal s and a coefficient storage means 3 comprising N storage locations for storing N filter coefficients $c_0, c_1, c_2 \ldots c_{N-3}, c_{N-2}, c_{N-1}$, each of which corresponds to one of said N symbols. The adaptive digital filter 1 further comprises first and second filter computation means $4_A, 4_B$ for performing filter computations on the basis of said symbols and said filter coefficients, for example for multiplying one of said symbols $s_0, s_1, s_2 \ldots s_{N-3}, s_{N-2}, s_{N-1}$ with the corresponding filter coefficient $c_0, c_1, c_2 \ldots c_{N-3}, c_{N-2}, c_{N-1}$. The first filter computation means $4_A$ is connected to the coefficient storage means 3 with a larger bit width than the second filter computation means $4_B$. In other words, the bit resolution of the first filter computation means $4_A$ is higher than the bit resolution of the second filter computation means $4_B$. The results of the filter computations performed by said first and second filter computation means $4_A, 4_B$ are supplied to adding means 5 which is capable of adding the results and a value stored in an intermediate storage location 51. control means 6 are connected to said storage means 2, said a coefficient storage means 3, said first and second filter computation means $4_A, 4_B$ and said adding means 5 to control the operation thereof as follows.

In accordance with an first clock signal, the previously stored symbols $s_0, s_3, s_2 \ldots s_{N-3}, s_{N-2}$ are shifted within said storage means 2 by one step to form new symbols $s_1, s_2 \ldots s_{N-3}, s_{N-2}, s_{N-1}$, respectively, and a symbol $s_n$ of said signal s is fed into said storage means 2 to form a new symbol $s_0$ Depending on a second clock signal, the control means 6 start the filter computation operation. In a first cycle, the 1st symbol $s_0$ and the corresponding coefficient $c_0$ are supplied to said first filter computation means $4_A$ and the (N/2)-th symbol $s_{N/2}$ and the corresponding coefficient $c_{N/2}$ are supplied to said second filter computation means $4_B$. The adding means 5 receive the results of the filter computations performed by said filter computation means $4_A, 4_B$ and are controlled to add the results and store the sum in the intermediate storage location 51 replacing any previously stored value. In a second cycle, the 2nd symbol $s_1$ and the corresponding filter coefficient $c_1$ are supplied to said first filter computation means $4_A$ and the (N/2+1)-th symbol $s_{N/2+1}$ and the corresponding coefficient $c_{N/2+1}$ are supplied to the second filter computation means $4_B$. The adding means 5 receive the results of the filter computations performed by said filter computation means $4_A$, $4_B$ and are controlled to add the results as well as the value stored in the intermediate storage location 51 and to store the sum in the intermediate storage location 51 replacing any previously stored value. The latter cycle is repeated for the 3rd to (N/2−1)-th symbols $s_3 \ldots s_{N/2-1}$ and corresponding coefficients $c_3 \ldots c_{N/2-1}$ and the (N/2+2)-th to (N)-the symbol $s_{N/2+2} \ldots s_{N-1}$ and corresponding coefficients $c_{N/2+2} \ldots c_{N-1}$. The filter computations are completed for all N symbols and the corresponding N coefficients after N/2 cycles. Thereafter, the value stored in the intermediate storage location 51 is output as the filter value e.

Figure 1:
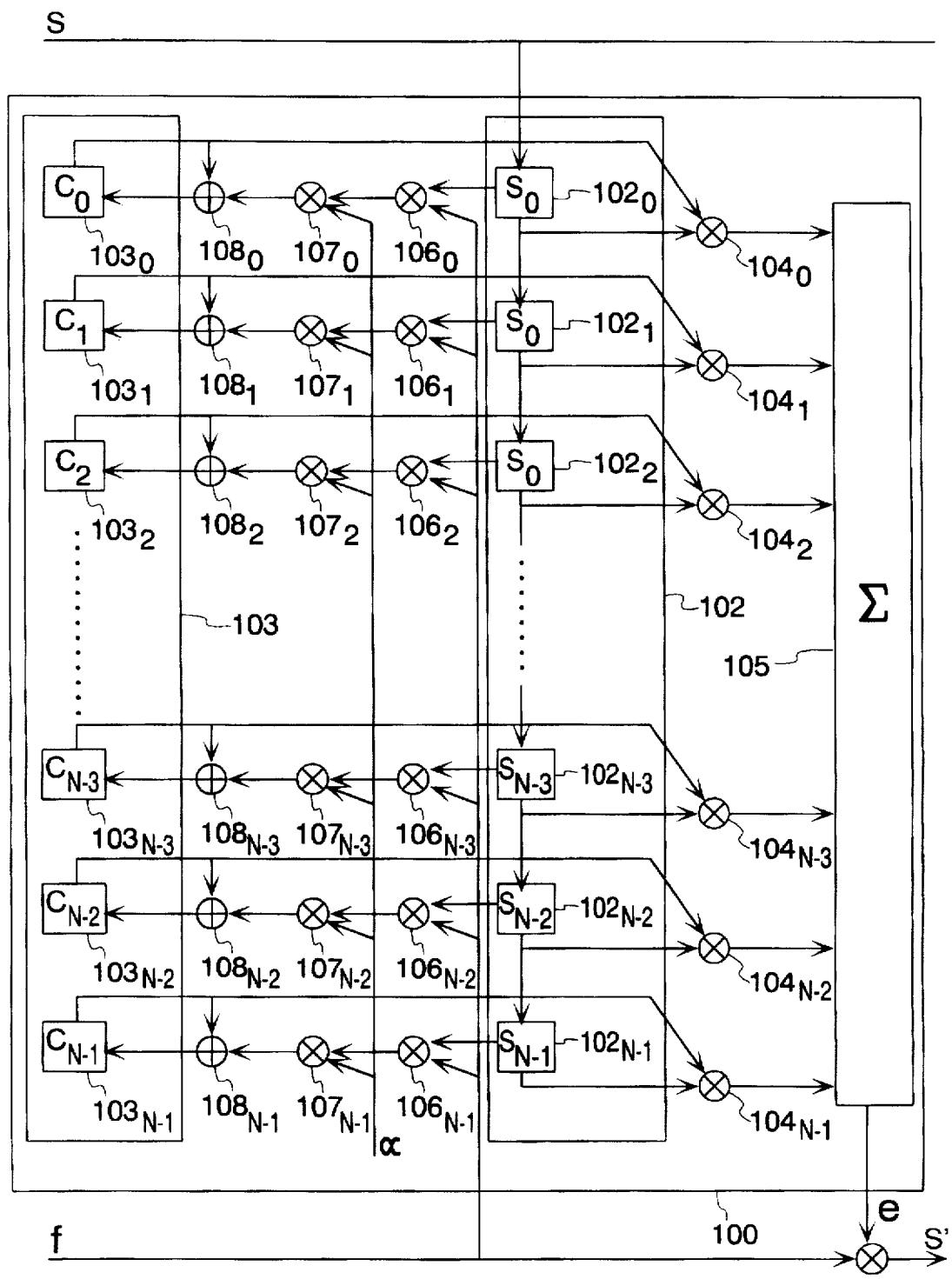
FIG. 1 shows a known adaptive digital filter with full parallel realization.
Figure 2:
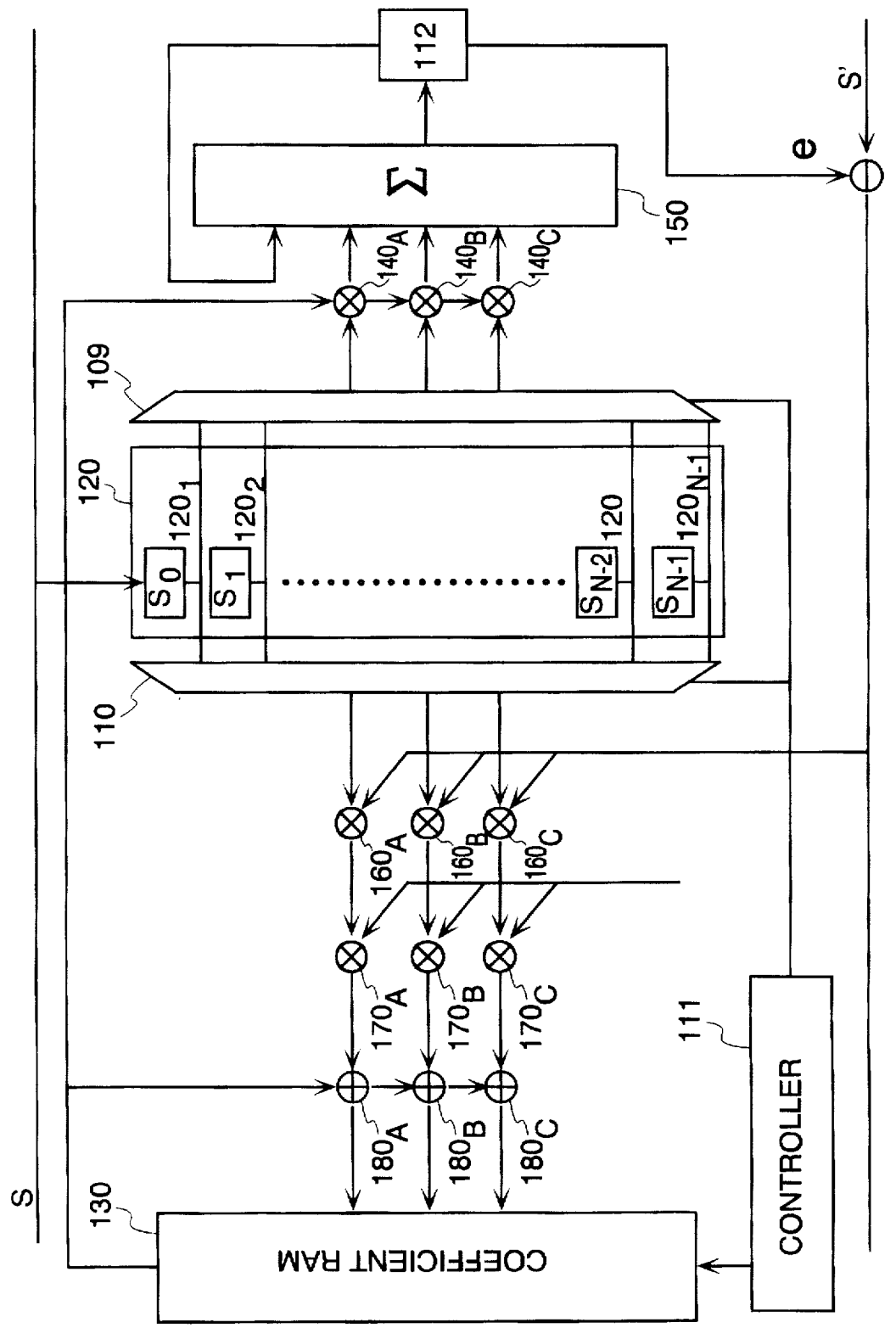
FIG. 2 shows a known adaptive digital filter with N/3 type resource sharing.
Figure 3:
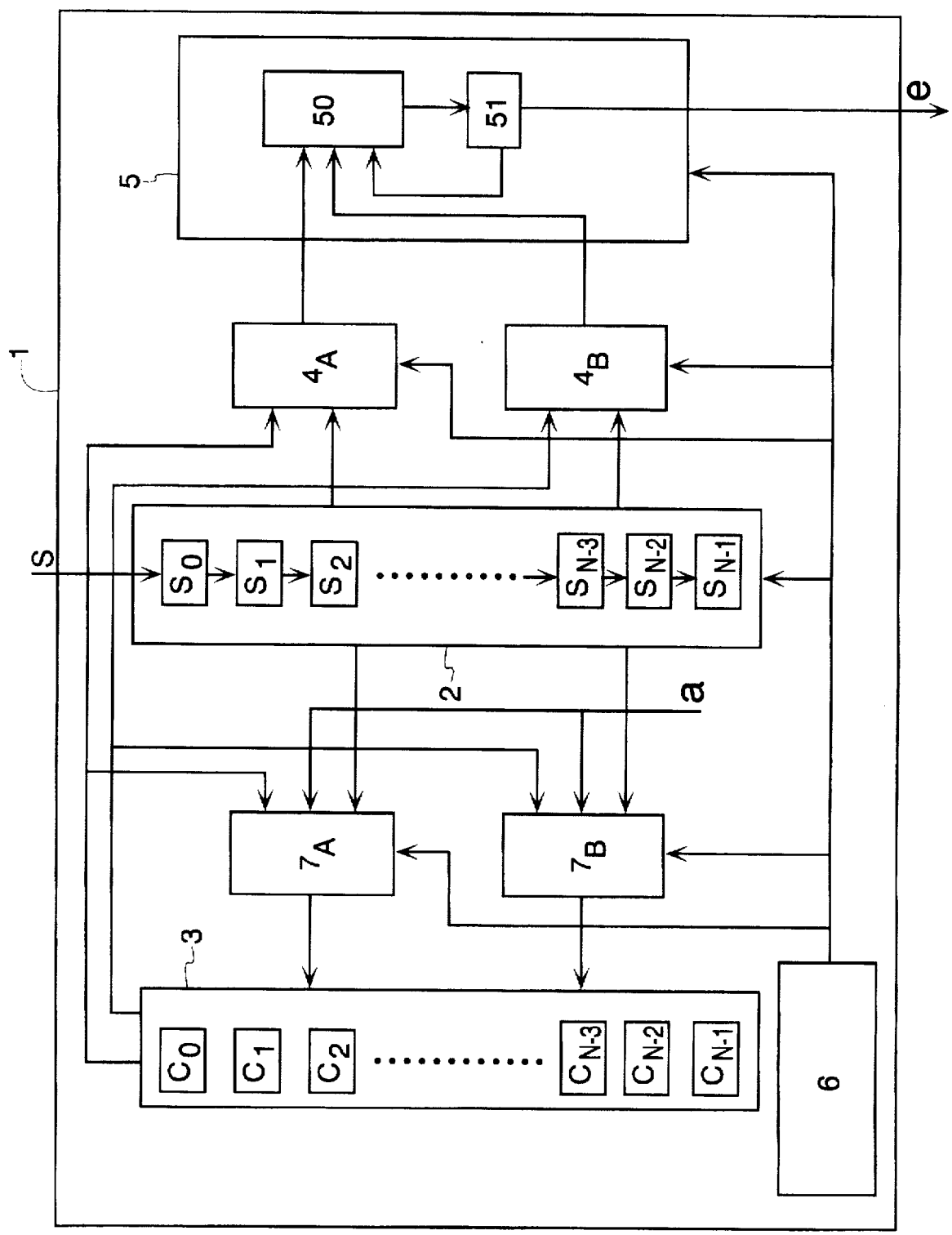
FIG. 3 shows an adaptive digital filter according to the present invention.

Furthermore, the adaptive digital filter 1 shown in FIG. 3 comprises first and second coefficient adapting means $7_A$, $7_B$ for adapting said filter coefficients $c_0$, $c_1$, $c_2 \ldots c_{N-3}$, $c_{N-2}$, $c_{N-1}$. The first coefficient adapting means $7_A$ is connected to the coefficient storage means 3 with a larger bit width than the second coefficient adapting means $7_B$. In other words, the bit resolution of the first coefficient adapting means $7_A$ is higher than the bit resolution of the second coefficient adapting means $7_B$. A coefficient adapting value a, preferably computed on the basis of the filter output e, for example by subtracting the filter output e from a received signal s', is supplied to the coefficient adapting means $7_A$, $7_B$. The control means 6 control the coefficient adapting operation simultaneously with the filter computations as follows.

After new symbols $s_0, s_1, s_2 \ldots s_{N-3}, s_{N-2}, s_{N-1}$ have been formed in accordance with the first clock signal, in the first cycle depending on the second clock signal, the 1st symbol $s_0$ and the corresponding coefficient $c_0$ are supplied to said first coefficient adapting means $7_A$ and the (N/2)-th symbol $s_{N/2}$ and the corresponding coefficient $c_{N/2}$ are supplied to said second filter coefficient adapting means $7_B$. The first and second coefficient adapting means $7_A$, $7_B$ compute adapted coefficients $c_0$ and $c_{N/2}$ and store the adapted coefficients in the respective storage locations in the coefficient storage means 3. In the second cycle, the 2nd symbol $s_1$ and the corresponding filter coefficient $c_1$ are supplied to said first coefficient adapting means $7_A$ and the (N/2+1)-th symbol $s_{N/2+1}$ and the corresponding coefficient $c_{N/2+1}$ are supplied to the second coefficient adapting means $7_B$. Again, the first and second coefficient adapting means $7_A$, $7_B$ compute adapted coefficients $c_1$ and $c_{N/2+1}$ and store the adapted coefficients in the respective storage locations in the coefficient storage means 3. The latter cycle is repeated for the 3rd to (N/2−1)-th symbols $s_3 \ldots s_{N/2-1}$ and corresponding coefficients $c_3 \ldots c_{N/2-1}$ and the (N/2+2)-th to (N)-the symbol $s_{N/2+2} \ldots s_{N-1}$ and corresponding coefficients $c_{N/2+2} \ldots c_{N-1}$. The coefficient adapting operation is also completed for all N coefficients after N/2 cycles.

Figure 4:
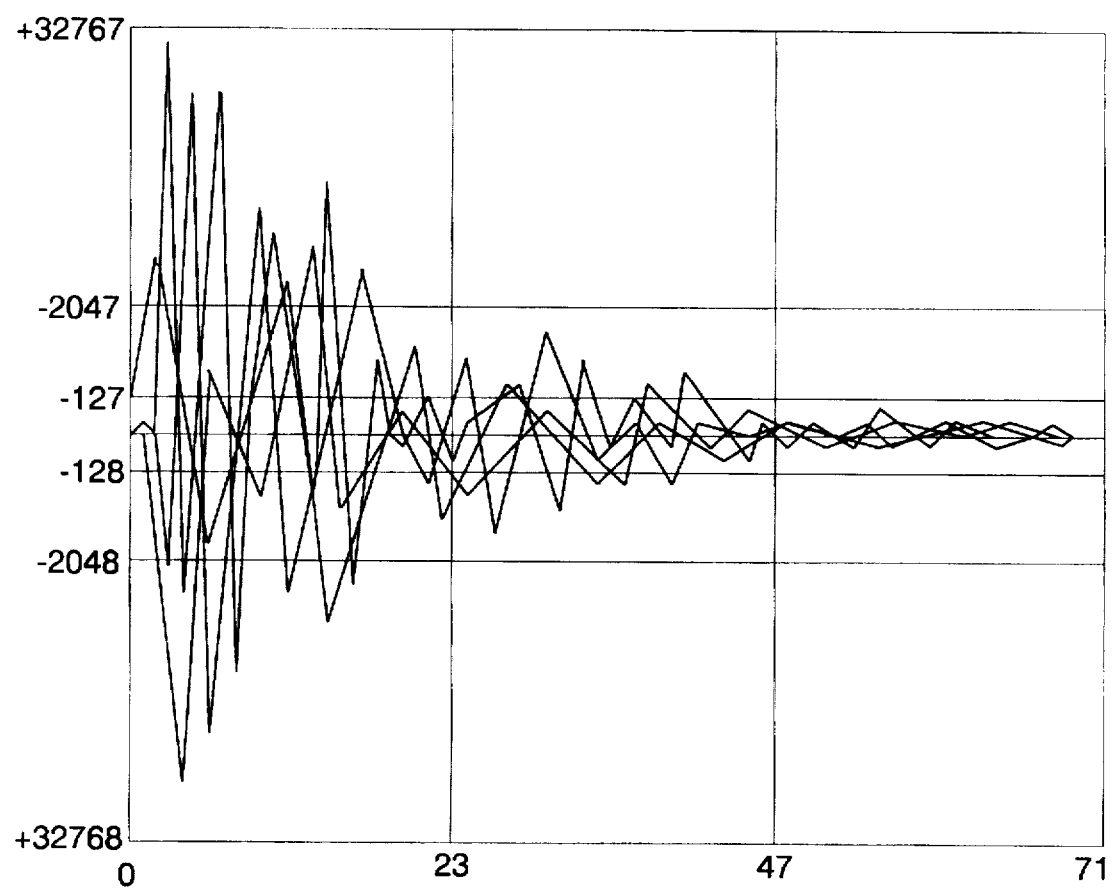
FIG. 4 shows several examples of transmission channel impulse response functions.

As mentioned above, the bit widths of the connections of the first filter computation means $4_A$ and the first coefficient adapting means $7_A$ with the coefficient storage means 3 are different from the bit widths of said connections of the second filter computation means $4_B$ and of the second coefficient adapting means $7_B$ and thus the bit resolution of the first filter computation means $4_A$ and the first coefficient adapting means $7_A$ is different from the bit resolution of the second filter computation means $4_B$ and the second coefficient adapting means $7_B$. The underlying principle is outlined in the following: as it can be observed in FIG. 4, the examples of transmission channel impulse response functions show a characteristic attenuation which progresses with the time after pulse emission. Accordingly, the magnitude of the respective filter coefficients $c_0$, $c_1 \ldots c_{N-2}$, $c_{N-1}$ also decreases and the filter operations are performed with, for increasing n, progressively smaller coefficients. The invention proposes an adaptive digital filter having a hardware structure which reflects said decreasing magnitude in form of a partially reduced bit resolution of specific circuit components. In the case of the embodiment described with respect to FIG. 3, the magnitude of the filter coefficients $c_0$, $c_1 \ldots c_{N/2-2}$, $c_{N/2-1}$ connected to the first filter computation means $4_A$ and to the first coefficient adaption means $7_A$ is larger than the magnitude of the filter coefficients $c_{N/2}$, $c_{N/2+1} \ldots c_{N-2}$, $c_{N-1}$ connected to the second filter computation means $4_B$ and to the second coefficient adaption means $7_B$. In accordance with the invention, the connections of the second filter computation means $4_B$ and the second coefficient adapting means $7_B$ with the coefficient storage means 3 is realized with smaller bit width than said connections of the first filter computation means $4_A$ and of the first coefficient adapting means $7_A$ and thus the second filter computation means $4_B$ is realized with smaller bit resolution than the first filter computation means $4_A$ and the second coefficient adapting means $7_B$ is realized with smaller bit resolution than the first coefficient adapting means $7_A$ and the coefficients are stored with different bit resolution in the coefficient storage means 3. Thereby, the hardware and the needed chip area are reduced.

It is understood, that in other embodiments of the present invention the bit width of the connection of second filter computation means $4_B$ with the coefficient storage means 3 can be realized with smaller bit resolution than said connection of the first filter computation means $4_A$ while the bit widths of said connections of the first and second coefficient adapting means $7_B$, $7_B$ can realized with equal bit width or vice versa. In other words, in other embodiments of the present invention the second filter computation means $4_B$ can be realized with smaller bit resolution than the first filter computation means $4_A$ while the first and second coefficient adapting means $7_B$, $7_B$ can realized with equal bit resolution or vice versa.

It is also understood, that further embodiments of the present invention with a larger number of filter computation means 7 and a larger number of coefficient adapting means 4 are possible and further, that the N symbols $s_0, s_1 \ldots s_{N-2}$, $s_{N-1}$ of the symbol history and the corresponding N filter coefficients $c_n$, $c_1 \ldots c_{N-2}$, $c_{N-1}$ can be assigned in any suitable order to the available filter computation means 4 and also can be assigned in any suitable order to the available coefficient adapting means 7.

In a second embodiment of the adaptive digital filter according to the present invention, the first and second filter computation means $4_A$, $4_B$ and the first and second coefficient adapting means $7_A$, $7_A$ and the adding means 5 are connected to a first and a second clock, instead of being connected to the control means 6. In this case the filter operation differs from the one described above as follows: in accordance with a signal from the first clock the intermediate storage location 51 of the adding means 5 is initialized with the value zero. In accordance with a signal from the second clock the first and second filter computation means $4_A$, $4_B$, as described above, compute a result value from the input values supplied by the storage means 2 and the coefficient storage means 3, both being controlled by control means 6 as described above. The first and the second coefficient adapting means $7_A$, $7_B$, as described above, compute a result value from the input values supplied by the storage means 2 and the coefficient storage means 3, both being controlled by control means 6 as described above, and the coefficient adapting value a. Further, the adding means 5 receive the results of the filter computations performed by said filter computation means $4_A$, $4_B$ and add the results and the value stored in the intermediate storage location 51 and store the sum in the intermediate storage location 51 replacing any previously stored value.

Figure 5:
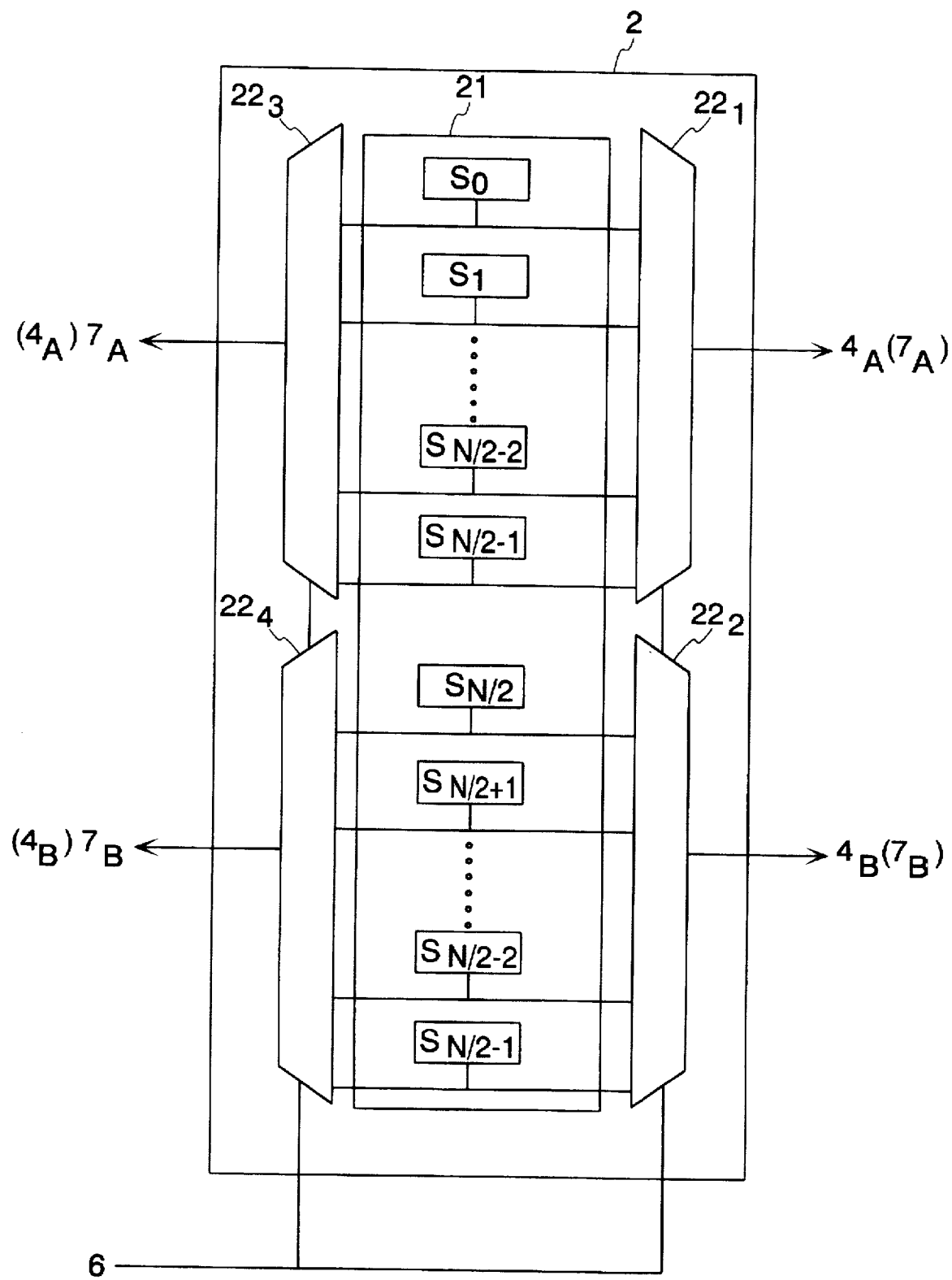
FIG. 5 shows a storage means for storing the symbols of the symbol history of an adaptive digital filter according to the present invention.

FIG. 5 shows an example the storage means 2 of the adaptive digital filter according to the present invention. It comprises a shift register 21 with N register steps $21_0$, $21_1 \ldots 21_{N-2}$, $21_{N-1}$ for storing the N symbols $s_0$, $s_1 \ldots s_{N-2}$, $s_{N-1}$ representing the symbol history of the signal s and four multiplexers $22_1$–$22_4$, controlled by the control means 6. The multiplexers $22_1$ and $22_3$ are connected to the register steps $21_{0, 211} \ldots 21_{N/2-2}$, $21_{N/2-1}$ of the shift register 21 and the multiplexers $22_2$ and $22_4$ are connected to the register steps $21_{N/2}$, $21_{N/2+1} \ldots 21_{N-2}$, $21_{N-1}$ of the shift register 21. Further, the multiplexer $22_1$, is connected to the filter computation means $4_A$, the multiplexer $22_2$ is connected to the filter computation means $4_B$ the multiplexer $22_3$ is connected to the coefficient adapting means $7_A$ and the multiplexer 224 is connected to the coefficient adapting means $7_B$.

During filter operation the multiplexers are controlled by the control means 6 such that for each cycle the multiplexers $22_1$ and $22_3$ are connected to one of the register steps $s_0$, $s_1 \ldots s_{N/2-2}$, $s_{N/2-1}$ and likewise the multiplexers $22_2$ and $22_4$ are connected to one of the register steps $s_{N/2}$, $s_{N/2+1} \ldots s_{N-2}$, $s_{N-1}$ to operate in parallel. In other words, during a first cycle the register step $s_0$ is connected to the first filter computation means $4_A$ and to the first coefficient adapting means $7_A$ and the register step $s_{N/2}$ is connected to the second filter computation means $4_B$ and to the second coefficient adapting means $7_B$. During the second cycle the register steps $s_1$ is connected to the first filter computation means $4_A$ and to the first coefficient adapting means $7_A$ and the register step $s_{N/2+1}$ is connected to the second filter computation means $4_B$ and to the second coefficient adapting means $7_B$ and likewise for the following cycles all register steps to N–3, N–2 and N–1.

It is understood that in other embodiments of the present invention the storage means 2 of FIG. 5 can be realized with only two multiplexers, either with the multiplexers $22_1$, $22_2$ or with the multiplexers $22_3$, $22_4$. In this case both, the first filter computation means $4_A$ and the first coefficient adapting means $7_A$ are connected to the multiplexer $22_1$, or to the multiplexer $22_3$, respectively, and both, the second filter computation means $4_B$ and the second coefficient adapting means $7_B$ are connected to the multiplexer $22_2$ or to the multiplexer $22_4$, respectively.

The filter computation means $4_B$ and $4_B$ preferably consist each of one multiplier which each is connected to the storage means 2, to the coefficient storage means 3 and to the adding means 5. During filter operation the multipliers multiply a symbol of the symbol history with the corresponding filter coefficient and the result signal is supplied to the adding means 5.

Figure 6:
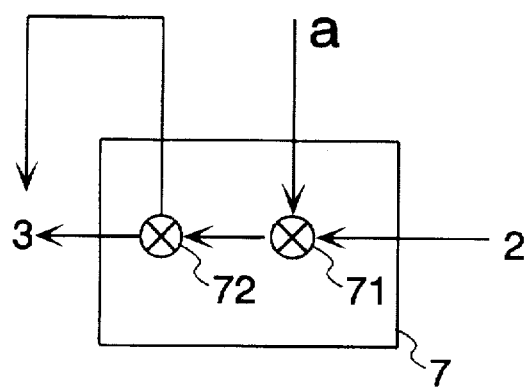
FIG. 6 shows a coefficient adapting means of an adaptive digital filter according to the present invention.

FIG. 6 shows a coefficient adapting means 7 of the adaptive digital filter according to the present invention. It comprises a multiplier 71 and an adder 72. The multiplier 71 is connected to receive the coefficient adapting value a and is connected to receive an input signal from the storage means 2. The adder 72 is connected to receive a signal from the multiplier 71 and from the coefficient storage means 3 and is connected to supply a result value to the coefficient storage means 3. During coefficient adapting operation the multiplier 71 multiplies the coefficient adapting value a with the input from the storage means 3 and supplies the result value to the adder 72. The adder 72 adds the result value and the input from the coefficient storage means 3 and supplies the sum to the coefficient storage means 3.

Figure 7:
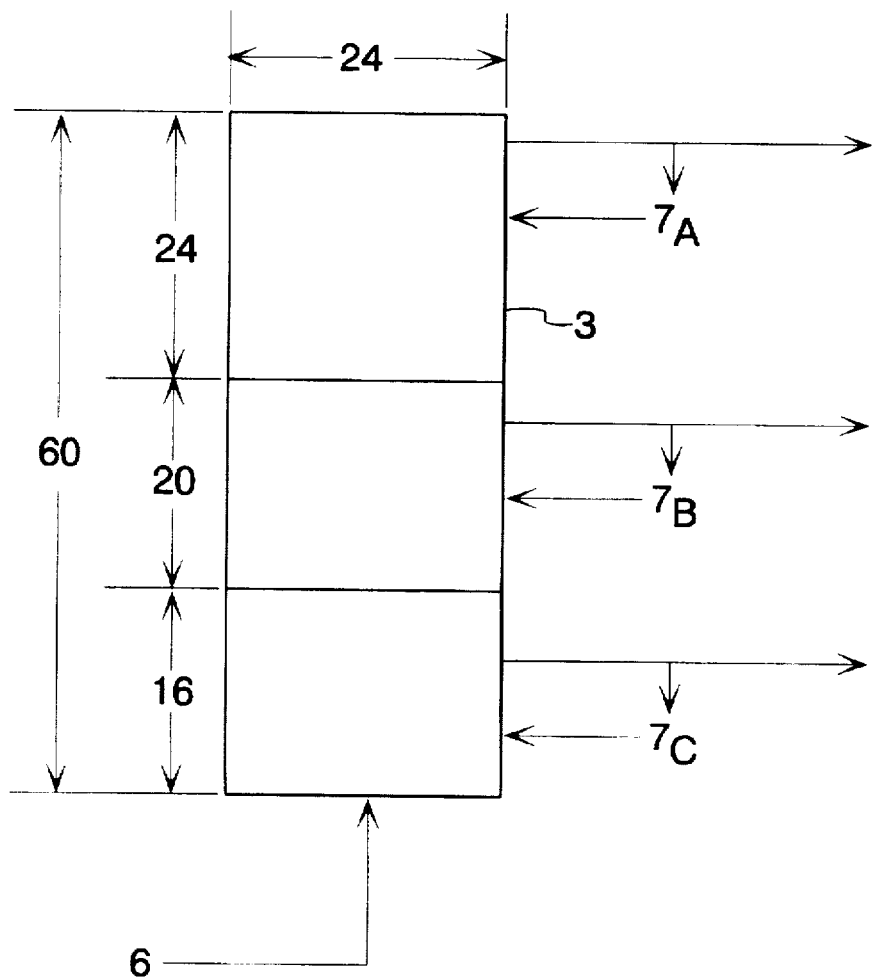
FIG. 7 shows a coefficient storage means of an adaptive digital filter with N/3 type resource sharing according to the present invention.

FIG. 7 shows an example of coefficient storage means 3 of the adaptive digital filter with N3 type resource sharing according to the present invention. The coefficient storage means 3 consists of a RAM of the size 24×60 bit for storing coefficients of different bit width. The adaptive digital filter of this embodiment has N=72 coefficients and three coefficient adapting means $7_A$, $7_B$ and $7_C$ and three filter computation means $4_A$, $4_B$ and $4_C$. The RAM 3 is connected to the control means 6 and connected to receive an input from each of the three coefficient adapting means $7_A$, $7_B$ and $7_C$ an to supply an output to each of the three filter computation means $4_A$, $4_B$ and $4_C$ and to each of the three coefficient adapting means $7_A$, $7_B$ and $7_C$. The RAM is addressed by the control means 6 such that the coefficients are read/written in three groups with the first group of 24 coefficients ($c_0$, $c_1 \ldots c_{22}$, $c_{23}$) being stored with a resolution of 24 bits, the second group of 24 coefficients ($c_{24}$, $c_{25} \ldots c_{46}$, $c_{47}$) being stored with a resolution of 20 bits and the third group of 24 coefficients ($c_{48}$, $c_{49} \ldots c_{70}$, $c_{71}$) being stored with a resolution of 16 bits.

Figure 8:
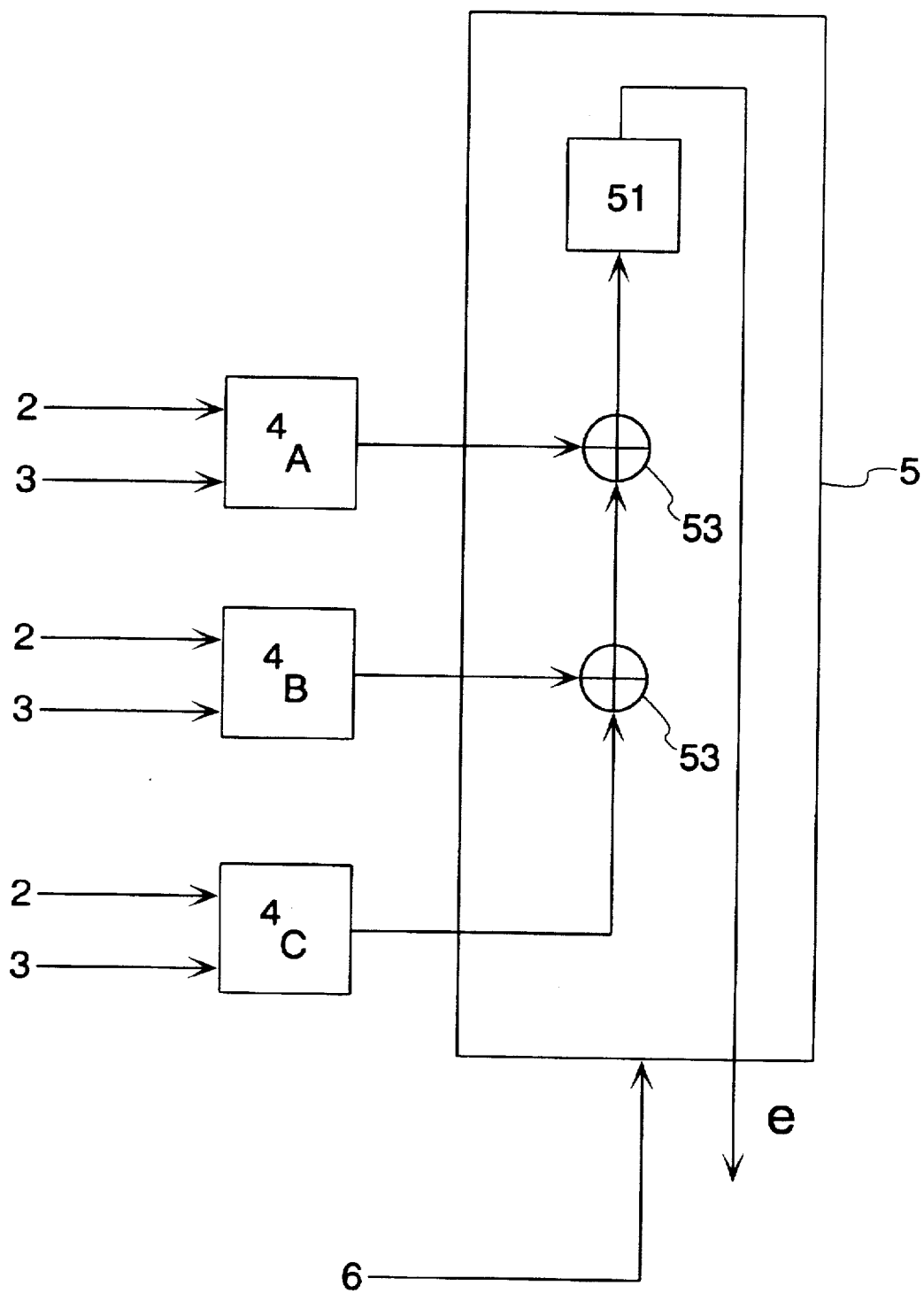
FIG. 8 shows an adding means of an adaptive digital filter with N/3 type resource sharing according to the present invention.

FIG. 8 shows a adding means 5 and three filter computation means $4_A$, $4_B$ and $4_C$ of the adaptive digital filter with N/3 type resource sharing according to the present invention. The bit resolution of the first filter computation means $4_A$ is larger than the bit resolution of the second filter computation means $4_B$ which bit resolution is larger than the bit resolution of the third filter computation means $4_C$. The adding means 5 consists of three adders 52, 53 and 54 and of an intermediate storage location 51. The first adder 52 has a smaller bit resolution than the second adder 53 and is connected to receive an input value from the third filter computation means $4_C$ and from the second filter computation means $4_B$. The second adder 53 has a smaller bit resolution than the third adder 54 and is connected to receive an input from the first adder 52 and from the first filter computation means $4_A$. The third adder 54 is connected to receive an input from the second adder 53 and from the intermediate storage location 51. The intermediate storage location 51 is connected to receive an input from the third adder 54 and outputs the filter signal e.

The operation of the adding means 5 is controlled by the control means 6. During a typical operation cycle of the adding means 5, the first adder 52 adds the values received from the third filter computation means $4_C$ and from the second filter computation means $4_B$. The second adder 53 adds the value received from the first filter computation means $4_A$ and the result value from the first adder 52. The third adder 54 adds the result value from the second adder 53 and the value stored in the intermediate storage location 51 and stores the result in the intermediate storage location 51 overwriting any previously stored value.

I claim:

1. An adaptive digital filter device, comprising:
storage means for storing a plurality of digital symbols ($s_0$, $s_1$, $s_2 \ldots s_{N-3}$, $s_{N-2}$, $s_{N-1}$) representing the symbol history of a signal s;
coefficient storage means for storing a plurality of filter coefficients to ($c_0$, $c_1 \ldots c_{N-3}$, $c_{N-2}$, $c_{N-1}$) each of which corresponds to one of said of symbols ($s_0, s_1, s_2 \ldots s_{N-3}, s_{N-2}, s_{N-1}$);

first and second filter computation means for performing filter computations on the basis of said symbols and said filter coefficients;

adding means for adding the output of said first and second filter computation means and for outputting a filter value e;

first and second coefficient adapting means for adapting said filter coefficients ($c_0, c_1, c_2 \ldots c_{N-3}, c_{N-2}, c_{N-1}$) stored in said coefficient storage means;

control means for controlling the operation of the adaptive digital filter; and filter computation connection apparatus for connecting said first and second filter computation means to said coefficient storage means with a different bit width to receive coefficients ($c_0, c_1 \ldots c_{N/2-2}, c_{N/2-1}; c_{N/2}, c_{N/2+1} \ldots c_{N-2}, c_{N-1}$) having different magnitudes and/or coefficient connection apparatus for connecting said first and second coefficient adapting means to said coefficient storage means with a different bit width to receive coefficients ($c_0, c_1 \ldots c_{N/2-2}, c_{N/2-1}; c_{N/2}, c_{N/2+1} \ldots c_{N-2}, c_{N-1}$) having different magnitudes.

2. An adaptive digital filter device according to claim 1 wherein said first filter computation means have a greater bit resolution than said second filter computation means.

3. An adaptive digital filter device according to claim 1 wherein said first coefficient adapting means have a greater bit resolution than said second coefficient adapting means.

4. An adaptive digital filter device according to claim 1 wherein said first filter computation means have a greater bit resolution than said second filter computation means and said first coefficient adapting means have a greater bit resolution than said second coefficient adapting means.

5. An adaptive digital filter device according to claim 1 wherein the storage means comprises a shift register and at least two multiplexers.

6. An adaptive digital filter device according to claim 1 wherein the filter computation means is a multiplier.

7. An adaptive digital filter device according to claim 1 wherein the coefficient adapting means comprises at least one multiplier and one adder.

8. An adaptive digital filter device according to claim 7 wherein the adding means comprises at least two adders with different bit resolutions.

9. An adaptive digital filter device according to claim 1 wherein the coefficient storage means comprises at least one coefficient RAM for storing coefficients in groups of different bit resolution.

10. An adaptive digital filter device according to claim 9 wherein the adding means comprise a plurality of adders all of which having different bit resolution.

11. An adaptive digital filter device according to claim 1 wherein the storage means comprises at least two RAM blocks having different bit size.

12. An adaptive digital filter device according to claim 1 wherein the adding means comprise an adder and an intermediate storage location.

13. An adaptive digital filter device, comprising:

storage means for storing a plurality of digital symbols ($s_0, s_1, s_2 \ldots s_{N-3}, s_{N-2}, s_{N-1}$) representing the symbol history of a signal s;

coefficient storage means for storing a plurality of filter coefficients ($c_0, c_1, c_2 \ldots c_{N-3}, c_{N-2}, c_{N-1}$) each of which corresponds to one of said of symbols ($s_0, s_1, s_2 \ldots s_{N-3}, s_{N-2}, s_{N-1}$);

first and second filter computation means for performing filter computations on the basis of said symbols and said filter coefficients;

adding means for adding the output of said first and second filter computation means and for outputting a filter value e;

first and second coefficient adapting means for adapting said filter coefficients ($c_0, c_1, c_2 \ldots c_{N-3}, c_{N-2}, c_{N-1}$) stored in said coefficient storage means;

control means for controlling the operation of the adaptive digital filter, said control means being connected to said storage means, said coefficient storage means, said first and second filter computation means said adding means and said first and second coefficient adapting means, wherein said first and second filter computation means are connected to said coefficient storage means with a different bit width to receive coefficients ($c_0, c_1 \ldots c_{N/2-2}, c_{N/2-1}; c_{N/2}, c_{N/2+1} \ldots c_{N-2}, c_{N-1}$) having different magnitudes, said first filter computation means having a greater bit resolution than said second filter computation means.

14. An adaptive digital filter device according to claim 13 wherein the storage means comprises a shift register and at least two multiplexers.

15. An adaptive digital filter device according to claim 13 wherein the filter computation means is a multiplier.

16. An adaptive digital filter device according to claim 13 wherein the coefficient storage means comprises at least one coefficient RAM for storing coefficients in groups of different bit resolution.

17. An adaptive digital filter device, comprising:

storage means for storing a plurality of digital symbols ($s_0, s_1, s_2 \ldots s_{N-3}, s_{N-2}, s_{N-1}$) representing the symbol history of a signal s;

coefficient storage means for storing a plurality of filter coefficients ($c_0, c_1, c_2 \ldots c_{N-3}, c_{N-2}, c_{N-1}$) each of which corresponds to one of said of symbols ($s_0, s_1, s_2 \ldots s_{N-3}, s_{N-2}, s_{N-1}$);

first and second filter computation means for performing filter computations on the basis of said symbols and said filter coefficients;

adding means for adding the output of said first and second filter computation means and for outputting a filter value e;

first and second coefficient adapting means for adapting said filter coefficients ($c_0, c_1, c_2 \ldots c_{N-3}, c_{N-2}, c_{N-1}$) stored in said coefficient storage means;

control means for controlling the operation of the adaptive digital filter, said control means being connected to said storage means, said coefficient storage means, said first and second filter computation means, said adding means and said first and second coefficient adapting means, wherein said first and second coefficient adapting means are connected to said coefficient storage means with a different bit width to receive coefficients ($c_0, c_1 \ldots c_{N/2-2}, c_{N/2-1}; c_{N/2}, c_{N/2+1} \ldots c_{N-2}, c_{N-1}$) having different magnitudes, said first coefficient adapting means having a greater bit resolution than said second coefficient adapting means.

18. An adaptive digital filter device according to claim 17 wherein the storage means comprises a shift register and at least two multiplexers.

19. An adaptive digital filter device according to claim 17 wherein the filter computation means is a multiplier.

20. An adaptive digital filter device according to claim 17 wherein the coefficient storage means comprises at least one coefficient RAM for storing coefficients in groups of different bit resolution.

21. An adaptive digital filter device, comprising:

storage means for storing a plurality of digital symbols ($s_0, s_1, s_2 \ldots s_{N-3}, s_{N-2}, s_{N-1}$) representing the symbol history of a signal s;

coefficient storage means for storing a plurality of filter coefficients ($c_0, c_1, c_2 \ldots c_{N-3}, c_{N-2}, c_{N-1}$) each of which corresponds to one of said of symbols ($s_0, s_1, s_2 \ldots s_{N-3}, s_{N-2}, s_{N-1}$);

first and second filter computation means for performing filter computations on the basis of said symbols and said filter coefficients;

adding means for adding the output of said first and second filter computation means and for outputting a filter value e;

first and second coefficient adapting means for adapting said filter coefficients ($c_0, c_1, c_2 \ldots c_{N-3}, c_{N-2}, c_{N-1}$) stored in said coefficient storage means;

control means for controlling the operation of the adaptive digital filter, said control means being connected to said storage means, said coefficient storage means, said first and second filter computation means, said adding means and said first and second coefficient adapting means, wherein said first and second filter computation means are connected to said coefficient storage means with a different bit width to receive coefficients ($c_0, c_1 \ldots c_{N/2-2}, c_{N/2-1}; c_{N/2}, c_{N/2+1} \ldots c_{N-2}, c_{N-1}$) having different magnitudes, said first filter computation means having a greater bit resolution than said second filter computation means and said first and second coefficient adapting means are connected to said coefficient storage means with a different bit width to receive coefficients ($c_0, c_1 \ldots c_{N/2-2}, c_{N/2-1}; c_{N/2}, c_{N/2+1} \ldots c_{N-2}, c_{N-1}$) having different magnitudes, said first coefficient adapting means having a greater bit resolution than said second coefficient adapting means.

22. An adaptive digital filter device according to claim 21 wherein the storage means comprises a shift register and at least two multiplexers.

23. An adaptive digital filter device according to claim 21 wherein the filter computation means is a multiplier.

24. An adaptive digital filter device according to claim 21 wherein the coefficient storage means comprises at least one coefficient RAM for storing coefficients in groups of different bit resolution.

* * * * *